(12) United States Patent
Seth et al.

(10) Patent No.: US 7,522,003 B2
(45) Date of Patent: Apr. 21, 2009

(54) CONSTANT MARGIN CMOS BIASING CIRCUIT

(75) Inventors: Sumantra Seth, Karnataka (IN); Somasunder Kattepura Sreenath, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/616,043

(22) Filed: Dec. 26, 2006

(65) Prior Publication Data

US 2008/0150638 A1 Jun. 26, 2008

(51) Int. Cl.
*H03F 3/04* (2006.01)

(52) U.S. Cl. .................. 330/296; 330/261
(58) Field of Classification Search .......... 330/296, 330/285, 253, 257, 261
See application file for complete search history.

(56) References Cited

U.S. PATENT DOCUMENTS

| | | | | |
|---|---|---|---|---|
| 4,092,611 A | * | 5/1978 | Frederiksen et al. | 330/261 |
| 5,212,455 A | * | 5/1993 | Pernici et al. | 330/253 |
| 5,587,674 A | * | 12/1996 | Danstrom | 327/67 |
| 7,205,840 B2 | * | 4/2007 | Gupta et al. | 330/260 |

* cited by examiner

*Primary Examiner*—Henry K Choe
(74) *Attorney, Agent, or Firm*—William B. Kempler; W. James Brady; Frederick J. Telecky, Jr.

(57) ABSTRACT

A biasing circuit is presented. The biasing circuit includes a primary biasing circuit, a replica circuit and an amplifier. The primary circuit provides a biasing voltage and a primary voltage. The biasing voltage is the output of the biasing circuit. The replica biasing circuit provides a replica voltage. The replica biasing circuit includes a first resistive element said first resistive element having a resistive characteristics; a first current source said first current source having the first resistive element for generating a current as a function of the first resistive element; a first node to couple to receive the first current source to generate the replica voltage at the first node; a second current source; a second node to coupled to receive the second current source, and a second resistive element coupled between the first noted and the second node, said second resistive element having substantially similar resistive characteristics to that of the first resistive element. The amplifier having a first input terminal to couple to receive the primary voltage from the primary biasing circuit, a second input terminal to couple to receive the replica voltage from the replica biasing circuit, and an output terminal to couple to the primary biasing circuit to adaptively adjust a current through the primary biasing circuit according to the received voltages. Further, a current mirror circuit is provided having the biasing circuit.

12 Claims, 4 Drawing Sheets

CONSTANT MARGIN CMOS BIASING CIRCUIT

The present invention relates generally to integrated circuits, and more particularly relates to biasing circuits.

BACKGROUND OF THE INVENTION

Current sources are one of the basic building blocks in Analog design. CMOS current mirror circuits are very accurate and simple compared to their Bipolar Junction Transistors (BJT) as MOS (Metal Oxide Semiconductor) input impedance is almost entirely capacitive. In ultra deep submicron technology (90/65 nm, technology), general assumption of the infinite DC input impedance of MOS is not entirely true, as the MOS in this domain has a dominant gate leakage current. The leakage current is amplified by a factor X which is the mismatch factor (or mirroring ratio of the current mirror circuit) of the transistors used in the circuit. Therefore it becomes difficult to mirror a small current with high accuracy and high mirroring ratio.

Further, output impedance of current source is an important parameter. The input and output headroom of a current source is generally important for determining the supply voltage or dynamic range of the current source. Cascoded current sources are usually preferred because of their low systematic offset due to their high output impedance. But these current sources often require higher input and output headroom. The input headroom is a sum of threshold voltage and overdrive voltage of a transistor used in the circuit.

There are active input current mirrors available but these current mirrors require a large input headroom. Further, in a simple current mirror that has a higher output conductance, gds, the drain to source voltage difference of the transistors may cause an error in the output current. This error is generally known as systematic offset. Cascoding the current mirror generally solves this problem by making the drain voltages same. However, cascading increases the input and output headroom requirements of the current mirror as mentioned earlier.

Furthermore, in ultra deep submicron technologies (e.g. 90 nm/65 nm process node), different types of transistors are available for selection. Therefore, mirror and cascode transistors may have to be carefully chosen to optimize area for better performance. In these circuits to reduce mismatch the mirror transistor may require a lower threshold voltage because the mismatch is lower for lower threshold voltages in case of submicron technology. The current mirroring error due to mismatch generally reduces linearly with overdrive voltage Von=VGS–VT, where VGS is the gate to source voltage and VT is the threshold voltage of the transistor. Therefore, the conventional biasing schemes may need higher headroom in highest overdrive corner, because bias margin on the mirror transistor is inversely proportional to the drive of the transistor.

Normally, in digital Complementary Metal Oxide Semiconductor (CMOS) processes the transistors are well controlled for VT and better drive current. This makes these transistors suitable for use as mirror transistor. For cascode, transistors with higher intrinsic gain (ratio of trans-conductance, gm, and output conductance, gds of a transistor) need to be selected. Therefore, thick gate oxide devices (or long channel devices) present in the process are generally good candidates for cascode, as they have small gds and moderate gm. Low voltage cascode using two different types of transistors can become difficult to bias across all PVT conditions in applications requiring low headroom.

Commonly used techniques for cascode biasing use transistors in linear region. This may require a higher headroom as the bias margin varies with PVT (process, voltage and temperature) and biasing different types of transistors as mirror and casecode transistor can become difficult with lower output headroom. In another possible biasing solution the transistors can be biased just on the edge of saturation by proper selection of transistors and current flowing through them. The margin for the mirror transistor can be adjusted using current flowing through the mirror. As a result, the bias margin of a transistor varies inversely with its drive. Therefore, it can require using large margins to bias the transistors across PVT. Although, the current mirror bias margin can remain constant across PVT for optimum headroom.

SUMMARY OF INVENTION

According to an aspect of the subject matter, there is provided a biasing circuit that includes a primary biasing circuit that provides a biasing voltage and a primary voltage. The biasing voltage being the output of the biasing circuit. Further, the biasing circuit includes a replica biasing circuit that provides a replica voltage. The replica biasing circuit includes a first resistive element having a resistive characteristics. Further, the replica biasing circuit includes a first current source having the first resistive element for generating a current as a function of the first resistive element.

Furthermore, the replica biasing circuit has a first node to couple to receive the first current source to generate the replica voltage at the first node. In addition, the replica biasing circuit includes a second current source, and a second node to couple to receive the second current source. Also, the replica biasing circuit includes a second resistive element coupled between the first noted and the second node. The second resistive element has substantially similar resistive characteristics to that of the first resistive element. The replica biasing circuit also includes an amplifier that has a first input terminal to couple to receive the primary voltage from the primary biasing circuit, a second input terminal to couple to receive the replica voltage from the replica biasing circuit, and an output terminal to couple to the primary biasing circuit to adaptively adjust a current through the primary biasing circuit according to the received voltages.

According to another aspect of the subject matter, there is provided a current mirror circuit that includes a biasing circuit. The biasing circuit, that includes a primary biasing circuit that provides a biasing voltage and a primary voltage. The biasing voltage being the output of the biasing circuit. Further, the biasing circuit includes a replica biasing circuit that provides a replica voltage. The replica biasing circuit includes a first resistive element having a resistive characteristics. Further, the replica biasing circuit includes a first current source having the first resistive element for generating a current as a function of the first resistive element. Furthermore, the replica biasing circuit has a first node to couple to receive the first current source to generate the replica voltage at the first node. In addition, the replica biasing circuit includes a second current source, and a second node to couple to receive the second current source. Also, the replica biasing circuit includes a second resistive element coupled between the first noted and the second node. The second resistive element has substantially similar resistive characteristics to that of the first resistive element. The replica biasing circuit also includes an amplifier that has a first input terminal to couple to receive the primary voltage from the primary biasing circuit, a second input terminal to couple to receive the replica voltage from the replica biasing circuit, and an output terminal to couple to the primary biasing circuit to adaptively adjust a current through the primary biasing circuit according to the received voltages.

The second node is provided with a transistor which is configured to operate in a saturation region. The amplifier is a differential amplifier. The replica biasing circuit, amplifier and primary biasing circuits are supplied with a reference current source for driving them.

According to a further aspect the discussion provides an integrated circuit comprising above discussed biasing circuit.

According to yet a further aspect the discussion provides an integrated circuit comprising above discussed current mirror circuit.

DETAIL DESCRIPTION OF FIGURES

Figure 1:
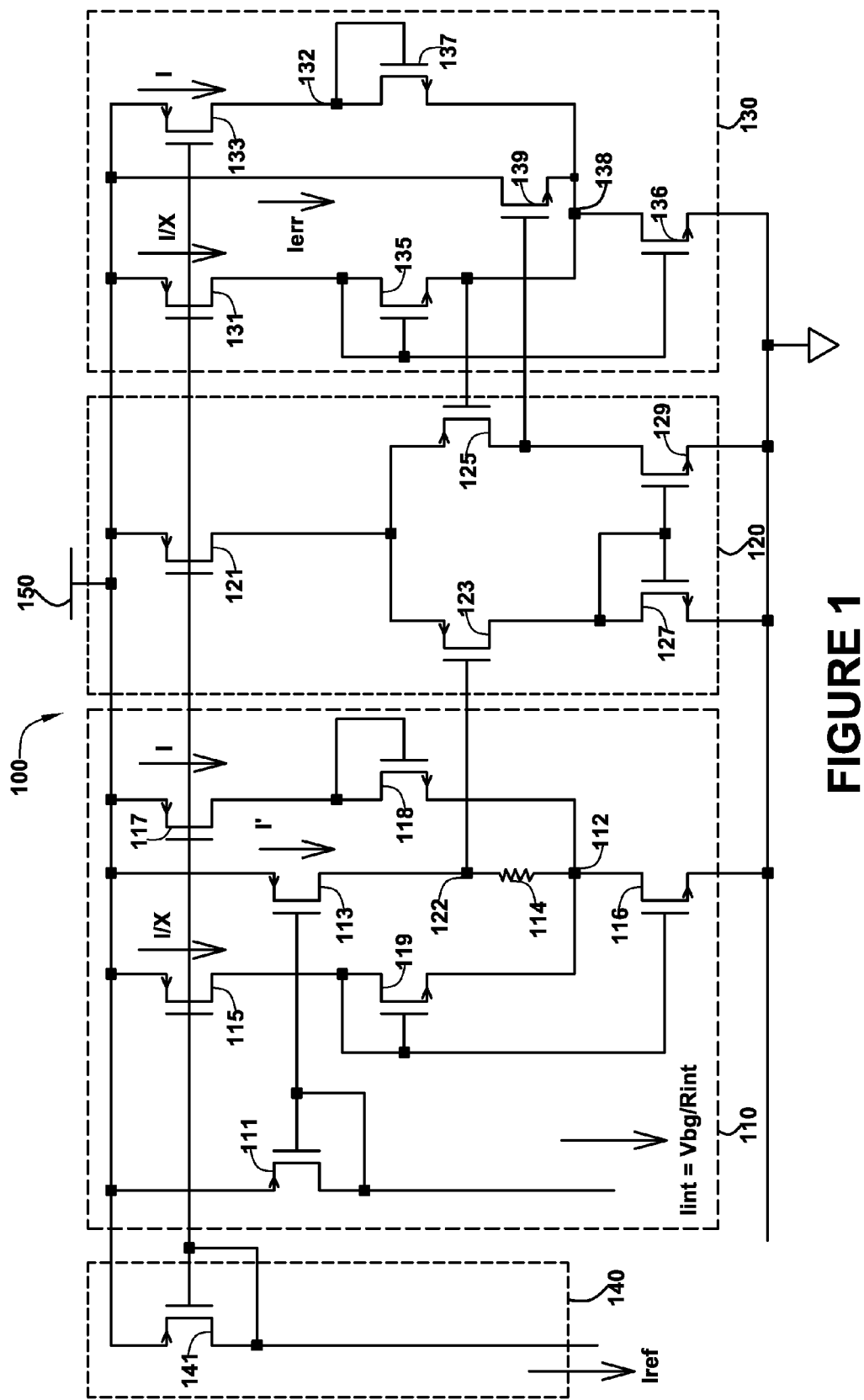
FIG. 1 shows a biasing circuit according to an embodiment of the present subject matter.

FIG. 1 shows an example biasing circuit 100. The biasing circuit 100 includes a plurality of transistors, each transistor has a first conducting terminal and a second conducting terminal and a gate. The biasing circuit 100 includes a primary biasing circuit 130, a replica biasing circuit 110 and an amplifier 120 and a reference current generator 140. The reference current generator 140 biases the primary biasing circuit 130, replica biasing circuit 110 and the amplifier 120. The characteristics of corresponding elements of the replica biasing circuit 110 and the primary biasing circuit 130 are selected to be substantially similar. That is the width verses length W/L ratios of the corresponding transistors in the replica biasing circuit 110 and the primary biasing circuit 130 are substantially similar. A first conducting terminal of each of transistors 141, 111, 113, 115, 117, 121, 131, 139 and 133 are coupled to a common power supply 150. A first conducting terminal of each of transistors 116, 127, 129 and 136 are coupled to a common ground.

The primary biasing circuit 130 includes transistors 131, 133, 135, 137, 139 and 136. The transistor 131 is coupled to a node 138 via transistor 135. The transistor 133 is coupled to the node 138 via transistor 137. A conducting terminal of the transistor 139 is coupled to node 138. The transistor 136 is coupled between ground and the node 138. Gate of the transistor 135 is coupled to a second conducting terminal of the transistor 131. Gate of the transistor 137 is coupled to a second conducting terminal of the transistor 133. Gate of the transistor 136 is coupled to gate of the transistor 135. Gate of the transistor 139 is coupled to a second conducting terminal of a transistor 125, which is an output of the amplifier 120.

The amplifier 120 includes transistors 121, 123, 125, 127 and 129. A second conducting terminal of the transistor 121 is coupled to first conducting terminals of the transistors 123 and 125. Gate of the transistors 127 and 129 is coupled to a second conducting terminal of the transistor 127. The second conducting terminals of the transistors 123 and 127 are coupled to each other. The second conducting terminals of the transistors 127 and 129 are also coupled to each other. Gate of the transistors 123 and 125 are respectively coupled to a second conducting terminal of the transistors 113 and 135.

The replica biasing circuit 110 includes the transistors 111, 113, 115, 118, 117, 119 and 116 and a resistive element 114. Gates of the transistors 111 and 113 are coupled to a second conducting terminal of the transistor 111. The transistor 115 is coupled to a node 112 via transistor 119. The transistor 117 is coupled to the node 112 via transistor 118. A conducting terminal of the transistor 113 is coupled to the node 112 via the resistive element 114. The transistor 116 is coupled between ground and the node 112. Gate of the transistor 119 and is coupled to a second conducting terminal of the transistor 115. Gate of the transistor 118 is coupled to a second conducting terminal of the transistor 117. Gate of the transistor 116 is coupled to gate of the transistor 119.

The reference current generator 140 includes a transistor 141. Gate of the transistor 141 is coupled to a second conducting terminal of the transistor 141.

This biasing circuit 100 can be used for a cascode as well as an active input current mirror. The transistor 119 is biased with a very small current I/x, where x is a scaling factor. The scale factor x is chosen such that I/x<<I, a typical value of x may be 10. A tracking current Iint, which is substantially same as current I, is generally available in SOC's, (System on Chip) and can be generated from a constant voltage Vbg. The constant voltage Vbg can be a bandgap voltage. The current Iint=Vbg/Rint, where Rint is a resistance of a resistance (not shown). The resistance Rint has known characteristics with respect to process, temperature and voltage. The resistive element 114 is selected such that the characteristics of Rint and resistive element 114 are substantially similar. Since, the current Iint is derived from a constant voltage Vbg the only variation is the current Iint may be caused due to the variation in resistance Rint observed due to PVT. Further, characteristics of the resistive element 114 are substantially similar to that of resistance Rint a substantially similar variation is observed in resistance of resistive element 114, resulting in a change in current I' through the resistive element 114 and hence providing a substantially constant voltage across the resistive element 114.

The transistor 116 is biased at a voltage very close to its saturation voltage. This can be ensured by the sizing of the transistor 116, the transistor 119 and proper selection of currents (I, I' and I/x as shown in FIG. 1). The transistor 118 is optional in the replica biasing circuit 110 and the replica biasing the circuit 110 can work without the transistor 118.

Now, if voltage at the node 112 is maintained at a voltage which is almost equal to the overdrive voltage of the transistors 116/136 then voltage at the node 122 can be a constant voltage which is equal to the voltage drop across the resistive element 114, above the overdrive voltage of transistor 116/136.

The amplifier 120 is a feedback amplifier. The gates of the transistors 125 and 123 are coupled to nodes 138 and 122 to ensure that these nodes are at substantially same voltage. The amplifier 120 responds to any imbalance in the voltage at the nodes 138 and 122 by adjusting the error current Ierr through the transistor 139. This generally ensures that the voltage at node 138 is maintained at substantially constant voltage and has a constant margin over actual overdrive voltage of the transistor 136 to provide the primary biasing voltage to the gate of transistor 125. The transistor 139 can be either a P-type MOS transistor or an N-type MOS transistor. If an N-type MOS transistor is used then output stage of the amplifier feedback loop, that is, the transistor 139 becomes a source follower and may not need compensation provided the source follower has bandwidth higher than UGB (Unity Gain Bandwidth) of the amplifier feed back loop. The P-type MOS transistor may also be used but in that case a compensation will be required due to introduction of a second gain stage in the loop. For a more detailed understanding of the compensation, reference is made to conventional methods of compensating in feedback systems, and these conventional methods can be found in standard text books.

It should be noted that the error current Ierr, is primarily dependent on the current drive and threshold voltage of the transistor 136. This provides flexibility to generate the current Ierr at one place in the chip and use it to bias similar current mirrors elsewhere in the chip. Performance in such cases will be primarily limited by the mismatches of threshold voltage and drive of the transistors 135,136,116,119. The node 138 can be used for biasing the mirror transistor in an active current mirror and the node 132 can be used for biasing a cascode with constant margin for a mirror transistor.

Figure 2:
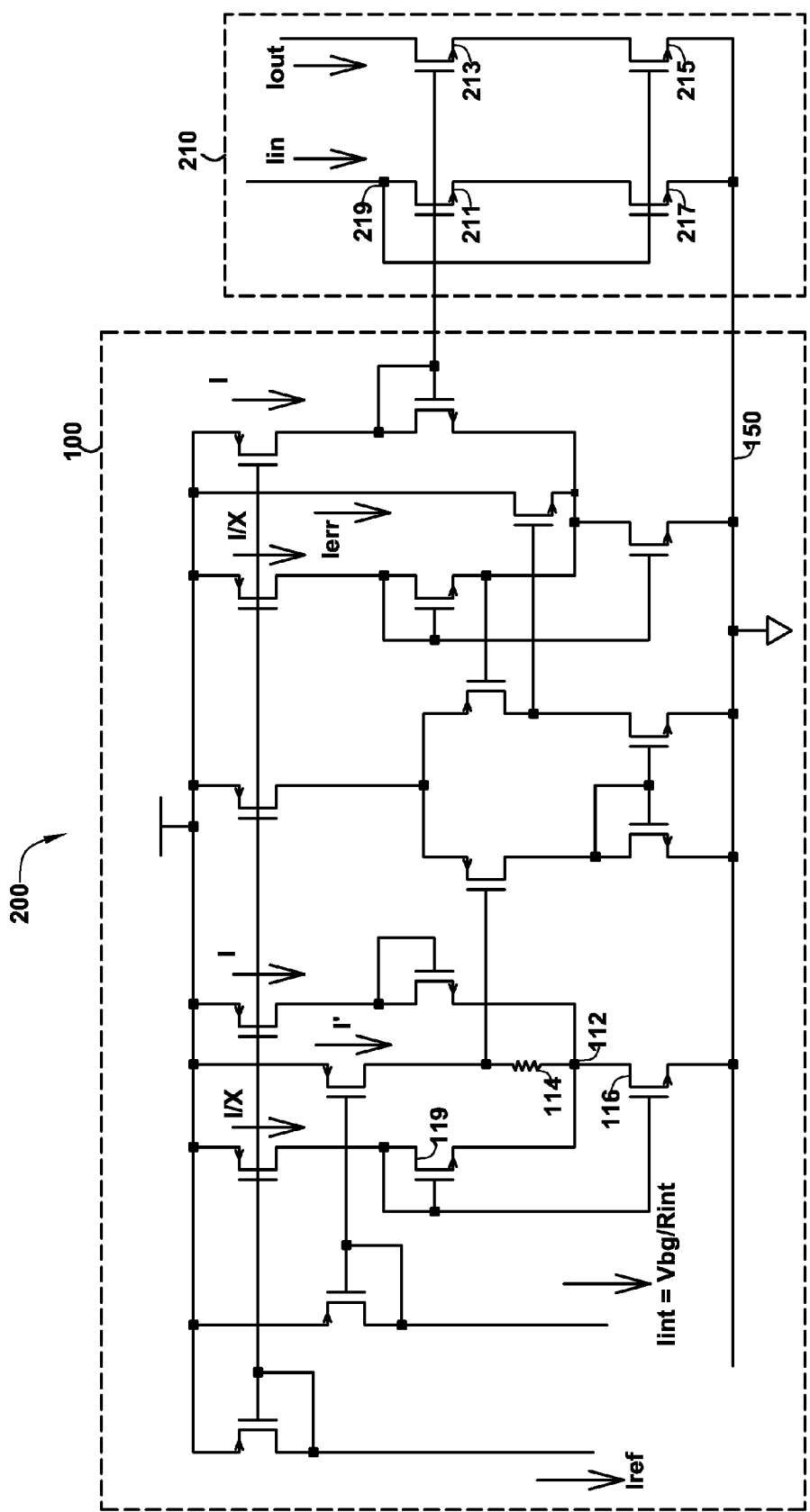
FIG. 2 shows a current mirror circuit according to an embodiment of the present subject matter.

FIG. 2 shows an embodiment 200 of a high swing cascode circuit 210 using biasing circuit 100 of FIG. 1. The cascode circuit 210 includes transistors 211, 213, 215 and 217. The transistors 211 and 217 are serially coupled. The transistors 213 and 215 are serially coupled. Gates of the transistors 211 and 213 are coupled to the node 132 of the biasing circuit 100 for receiving a biasing voltage at the gate of transistor 137. Gates of the transistors 215 and 217 are coupled to a node 219. One of the conducting terminals of the transistors 215 and 217 are coupled to a common ground 151. A current Iin flows through the transistors 211 and 217 and a current Iout flows through the transistors 213 and 215.

Following discussion will explain the relationship amongst currents I', I, and Iin and W/L ratios of the transistors 119, 116 and 217. It should be noted that a reference is made to an N-type MOS transistor circuit 200 for discussing relation amongst various current flowing through the circuit 200. However, a person skilled in the art will appreciate that the discussion is not limited to N-type MOS transistors and a similar discussion is valid for P-type MOS transistor circuit as well.

Now, we derive the relationship between the currents I', I, and Iin and W/L ratios of the transistors 119, 116 and 217. The voltage at node 112 (say, Vx)—which is the drain voltage of the transistor 116- is maintained equal to the overdrive voltage of transistor 217. Assuming the transistor 116 is biased in linear region, and if currents through the transistor 119 and the resistive element 114 are I/x and I', respectively. Then the current I'=I(1+Δ)/x, where Δ represents variation in resistance of the resistive element 114 and x is a scaling factor. The scale factor x is chosen such that I/x<<I, a typical value of x may be 10. Iin current is the input current for a current mirror. The current Iref and Iin are derived from the same source but they can have a scaling factor between them depending on the mirroring requirement. Iref is used for generating the bias (for simplicity in calculation we can assume Iref=Iin). The voltage Vbg may be a bandgap voltage and may be derived from any diode arrangement. Hence current Iref is process, supply voltage, temperature invariant. Threshold voltages of the transistors 116 and 119 are represented by VT1 and VT2 respectively. The W/L ratios of the transistors 116, 119 and 217 are represented by $(W/L)_1$, $(W/L)_2$ and $(W/L)_0$ respectively. A relation between the drain current of transistor 116 and the voltage Vx may be given by equation (1) where $V_{on}$ is overdrive voltage of the transistor 217 $C_{ox}$ is oxide capacitance per unit area and μ is the mobility of charge particles.

$$(W/L)_1 \mu C_{ox}\left[\left(V_x + V_{T2} + \sqrt{\frac{2I}{x\mu C_{ox}(W/L)_2}} - V_{T1}\right)V_x - \frac{V_x^2}{2}\right] = \quad (1)$$

$$I\left(1 + \frac{1}{x} + \frac{1+\Delta}{x}\right)$$

$$\frac{(W/L)_1}{(W/L)_0}\left[\left(\frac{V_x}{V_{on}}\right)^2 + 2(V_{T2} - V_{T1})\left(\frac{V_x}{V_{on}^2}\right) + \frac{2}{x}\left(\frac{V_x}{V_{on}}\right)\right] = \left(1 + \frac{1}{x} + \frac{1+\Delta}{x}\right), \quad (2)$$

$$\text{where } V_{on} = \sqrt{\frac{2I}{(W/L)_0 \mu C_{ox}}}$$

$$\frac{(W/L)_1}{(W/L)_0} = \left(\frac{\left(1 + \frac{2}{x} + \frac{\Delta}{x}\right)}{\left(1 + \frac{2}{x} + 2\left[\frac{(V_{T2} - V_{T1})}{V_{on}}\right]_{max}\right)}\right) \quad (3)$$

Assuming that a ratio $(W/L)_0/(W/L)_2=1/x$ (it should be noted that this ratio is chosen for simplicity and is not a mandatory requirement) then equation (1) reduces to equation (2). Equation (2) represents a relation between the main mirror transistor 217 and the biasing transistor 116.

From equation (2) a ratio $$\frac{(W/L)_1}{(W/L)_0}$$

can be derived said ratio is shown in equation (3) assuming $V_x=V_{on}$. It can further be noted that by a proper selection of x, voltage $V_x$ could be made almost equal to $V_{on}$ of the mirror transistor 217. Further, an expression for a high $V_{on}$ can be given in equation (3). The ratio $$\frac{(W/L)_1}{(W/L)_0}$$

can be close to unity to prevent deviation from the constant bias margin of mirror transistor 217. The deviation from constant bias margin corresponds to the deviation of $$\frac{V_x}{V_{on}}$$

from unity.

Figure 3:
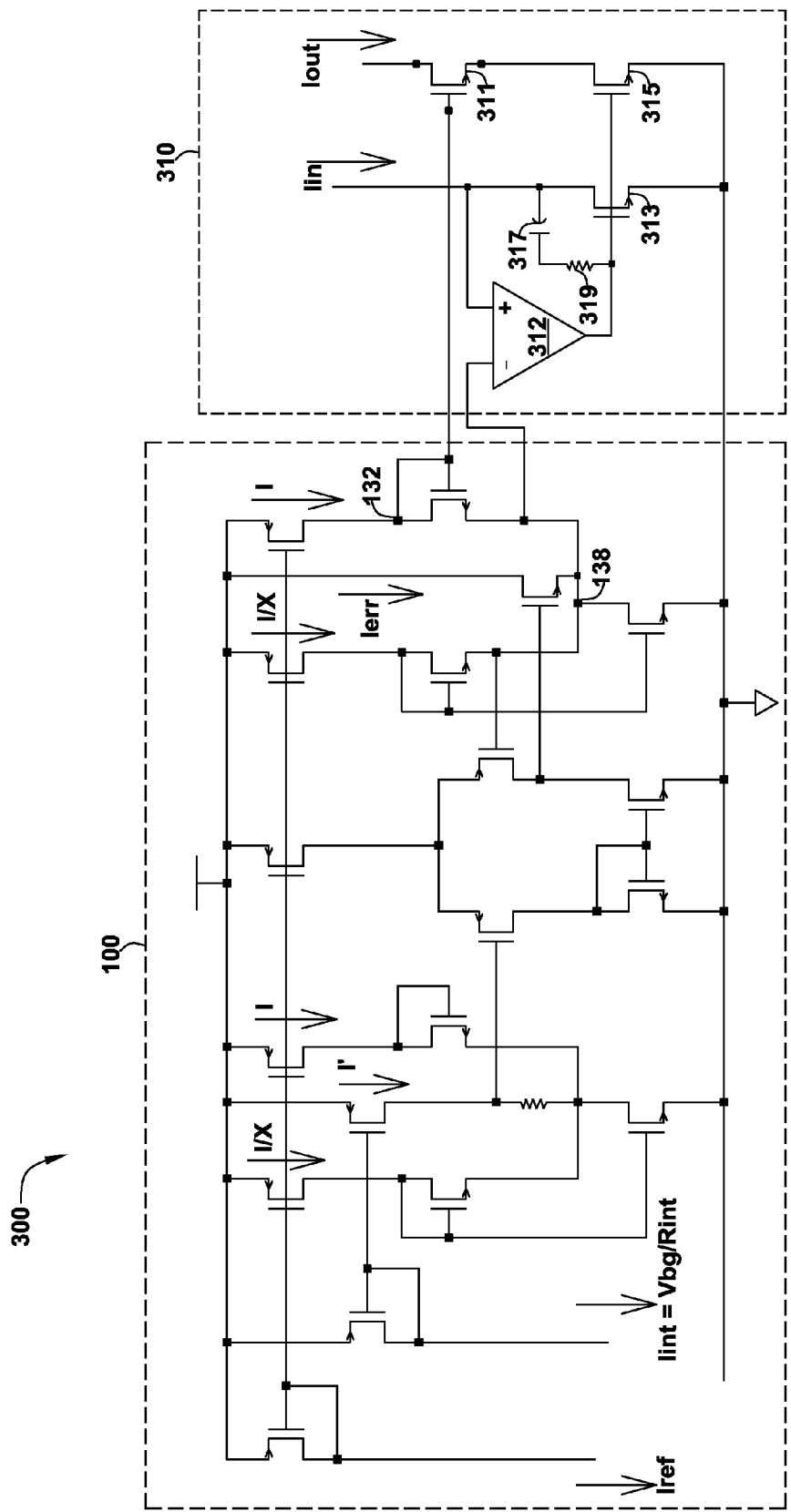
FIG. 3 shows another embodiment of a current mirror circuit according to an embodiment of the present subject matter.

FIG. 3 shows another embodiment of cascode current mirror circuit 300. The cascade current mirror circuit 300 is a gate leakage insensitive biasing circuit for cascoded current mirror transistor with desired headroom. The circuit allows use of different transistors in a cascode current mirror. The cascade current mirror circuit 300 has an amplifier 312 that provides gate leakage. The cascode current mirror circuit 310 has transistors 313, 315 and 311. The transistors 311 and 315 are serially coupled. Gate of the transistor 311 is coupled to the node 132. Gate of the transistors 313 and 315 are coupled to the output of the amplifier 312. A compensation circuit having a resister 319 and a capacitor 317 are coupled across a first input of the amplifier 312 and output of the amplifier 312. The first input of the amplifier 312 is coupled to a conducting terminal of transistor 313 as shown in figure. A second input of the amplifier 312 is coupled to node 138 which provides a reference voltage for the amplifier 312. The cascode circuit 300 is biased using the biasing circuit 100 (Shown in FIG. 1 ). The biasing margin observed by the transistors 313 and 315 is independent of cascode transistor gate leakage, as feedback correction generally ensures constant bias margin. The cascode gate leakage sets node 138 to a lower voltage causing VDS (Voltage difference between Drain and Source terminals of a transistor) mismatch between the transistors 313 and 315. Usually, the cascode transistors are biased with small overdrive voltages resulting in insignificant VDS error between the transistors 313 and 315 by selecting thick oxide transistors, having negligible gate leakage as the cascode transistor. The bias margin can also get affected due to the mismatch in un and Iref currents and mismatches in transistors. For a more detailed understanding of the compensation circuit, reference is made to conventional methods of compensating in feedback systems. One such method is discussed in the text book "Design of Analog CMOS Integrated Circuits, Behzad Razavi, McFrawHill Chapter 10". A finite gain of amplifier 312 causes VDS (drain to source voltage) mismatch at the transistors 313 and 315 resulting in systematic offset. The topology has been shown for an N-type MOS current mirror, but this is equally applicable for P-type MOS current mirrors.

Figure 4:
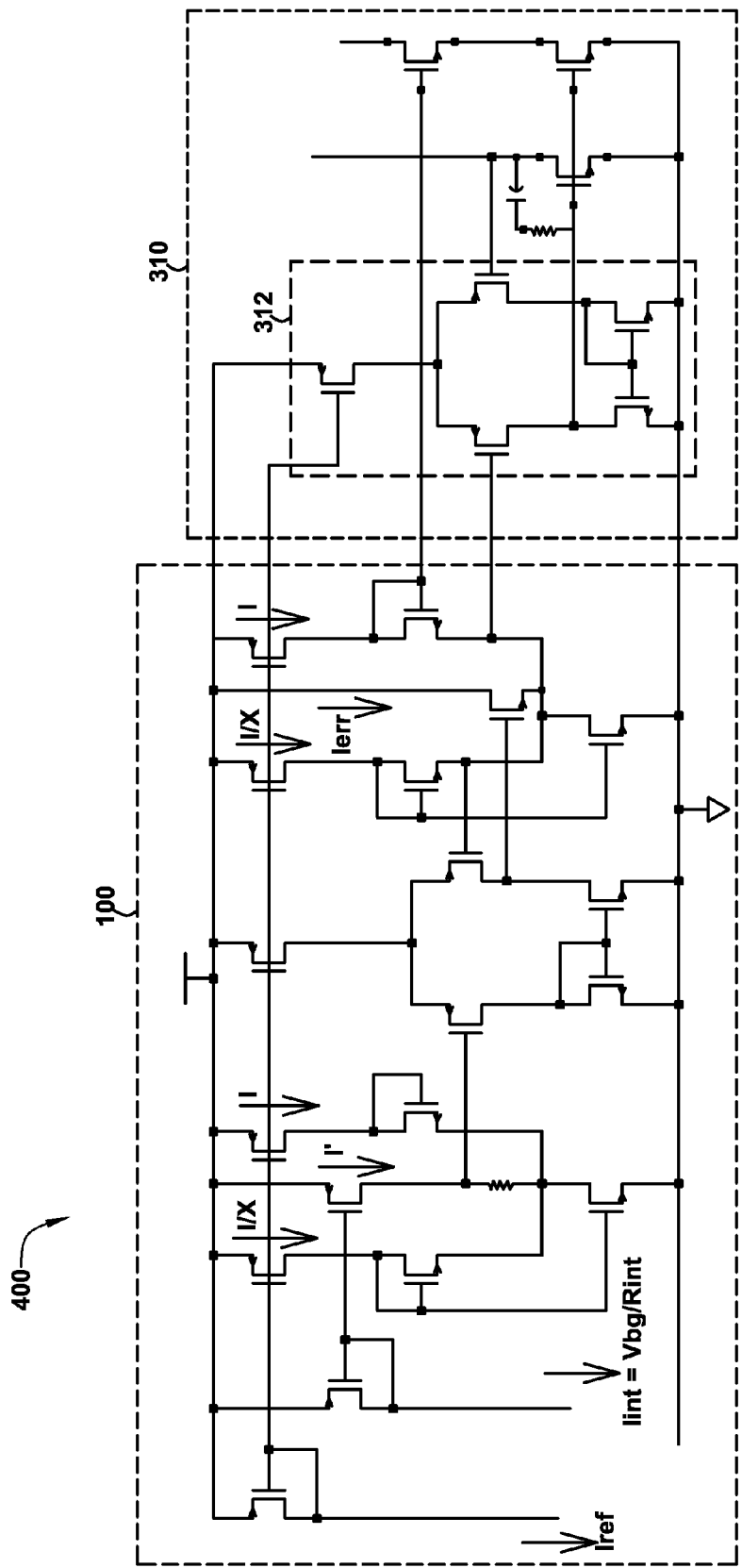
FIG. 4 shows yet another embodiment of a current mirror circuit according to an embodiment of the present subject matter.

FIG. 4 shows an embodiment of the cascode current mirror circuit 300 shown in FIG. 3. FIG. 4 shows an exploded view of the amplifier 312 shown in FIG. 3.

The biasing circuit according to present discussion provides a plurality of advantages including advantages discussed hereinafter but not limited to the discussed advantages.

The biasing circuit of the present subject matter produces an error current Ierr, which is a function of transistor drive and of threshold voltages as mentioned earlier and the biasing circuit 100 (Shown in FIG. 1) can be used for biasing plurality of similar current mirrors on an Silicon On Chip (SOC). Placing the biasing circuit only once on an SOC is sufficient for biasing all similar current mirrors present on the SOC, this allows an optimum use of the silicon area and power. In the proposed circuit, bias margin is not a function of the overdrive voltage. The discussion provides gate leakage insensitive current mirror architecture along with constant bias margin generation circuit. This enables designers to build very accurate current mirrors with lower area. Hence, provides a bias margin for all the similar current mirrors on the SOC as function of difference of the drive and threshold voltages. Further a complete gate leakage insensitive current mirror topology with optimum biasing is provided. This topology is useful incase of ultra deep submicron processes (90 nm/65 nm/45 nm) with high gate leakages. Furthermore, this topology provides constant bias margin across PVT. This enables designers to optimize current mirror size to get similar mismatch performance by increasing overdrive voltage. The biasing circuit of the present subject matter can be used in any CMOS process with or without gate leakage.

The above-described apparatus provide various circuits to provide a constant margin biasing circuit that can be used with a gate leakage insensitive current mirror circuitry. The decoupling capacitance to ground can also be added from the mirroring gate node to reduce the ground noise effect without affecting stability of the current mirror circuitry. The above described circuits are described using NMOS based current mirror circuits, but they are equally applicable for PMOS based current mirror circuits.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled. As shown herein, the present invention can be implemented in a number of different embodiments, including various apparatus and systems. Other embodiments will be readily apparent to those of ordinary skill in the art. The elements and sequence of operations can all be varied to suit particular requirements.

Figures are merely representational and are not drawn to scale. Certain proportions thereof may be exaggerated, while others may be minimized. Figures illustrate various embodiments of the invention that can be understood and appropriately carried out by those of ordinary skill in the art. It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The invention claimed is:

1. A biasing circuit for a current mirror comprising:
a primary biasing circuit that provides a biasing voltage and a primary biasing voltage, the biasing
voltage being the output of the primary biasing circuit generating an input current for a current mirror;
a replica biasing circuit that provides a replica voltage; and
an amplifier having a first input terminal coupled to receive the primary voltage from the primary biasing circuit, a second input terminal coupled to receive the replica voltage from the replica biasing circuit, and an output terminal coupled to the primary biasing circuit to adaptively adjust a current through the primary biasing circuit according to the received voltages, wherein said replica biasing circuit comprises:
a first resistive element, wherein said first resistive element resistive characteristics;
a first current source, wherein said first current source having the first resistive element for generating a current as a function of the first resistive element;
a first node to couple to receive the first current source to generate the replica voltage at the first node;
a second current source;
a second node to coupled to receive the second current source; and
a second resistive element coupled between the first node and the second node, said second resistive element having substantially similar resistive characteristics to that of the first resistive element.

2. The biasing circuit as claimed in claim 1, wherein said second input terminal is provided with a transistor.

3. The biasing circuit as claimed in claim 2, wherein said transistor is configured to operate in a saturation region.

4. The biasing circuit as claimed in claim 3, wherein said amplifier is a differential amplifier.

5. The biasing circuit as claimed in claim 1, wherein said replica biasing circuit, amplifier and primary biasing circuits are supplied with a reference current source for driving them.

6. A current mirror circuit comprising:
a biasing circuit, wherein said biasing circuit comprising:
a primary biasing circuit that provides a biasing voltage and a primary voltage, said biasing voltage being the output of the primary biasing circuit and coupled to a current mirror for generating an input current therefor;
a replica biasing circuit that provides a replica voltage; and
an amplifier having a first input terminal coupled to receive the primary voltage from the primary biasing circuit, a second input terminal coupled to receive the replica voltage from the replica biasing circuit, and an output terminal coupled to the primary biasing circuit to adaptively adjust a current through the primary biasing circuit according to the received voltages, wherein said replica biasing circuit comprising:
a first resistive element said first resistive element having a resistive characteristics;
a first current source said first current source having the first resistive element for generating a current as a function of the first resistive element;

a first node to couple to receive the first current source to generate the replica voltage at the first node;

a second current source;

a second node to coupled to receive the second current source; and a second resistive element coupled between the first node and the second node, said second resistive element having substantially similar resistive characteristics to that of the first resistive element.

7. The current mirror circuit claimed in claim 6, wherein said second input terminal is provided with a transistor.

8. The current mirror circuit as claimed in claim 7, wherein said transistor is configured to operate in a saturation region.

9. The current mirror circuit as claimed in claim 8, wherein said amplifier is a differential amplifier.

10. The current mirror circuit as claimed in claim 6, wherein said replica biasing circuit, amplifier and primary biasing circuits are supplied with a reference current source for driving them.

11. An integrated circuit comprising the biasing circuit according to claim 1.

12. An integrated circuit comprising the current mirror circuit according to claim 6.

* * * * *